(12) United States Patent
Ahn et al.

(10) Patent No.: US 7,534,023 B2
(45) Date of Patent: May 19, 2009

(54) BACKLIGHT UNIT

(75) Inventors: Jong Ki Ahn, Daegu-si (KR); Jeong Deuk Yeo, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/476,646

(22) Filed: Jun. 29, 2006

(65) Prior Publication Data
US 2007/0002580 A1   Jan. 4, 2007

(30) Foreign Application Priority Data
Jun. 30, 2005   (KR)   ........................ 10-2005-0058413

(51) Int. Cl.
*F21V 8/00* (2006.01)
(52) U.S. Cl. .................. 362/561; 362/558; 362/228
(58) Field of Classification Search ............... 362/561, 362/555, 558, 560, 511, 330, 228; 349/65, 349/62, 149–150
See application file for complete search history.

(56) References Cited

U.S. PATENT DOCUMENTS

| 4,882,659 | A | * | 11/1989 | Gloudemans | ............... 362/511 |
| 5,211,463 | A | * | 5/1993 | Kalmanash | ................... 362/26 |
| 5,956,107 | A | * | 9/1999 | Hashimoto et al. | ............ 349/64 |
| 6,379,024 | B1 | * | 4/2002 | Kogure et al. | ............... 362/263 |
| 2004/0080925 | A1 | * | 4/2004 | Moon | .......................... 362/29 |

FOREIGN PATENT DOCUMENTS

| JP | 2002-132193 A | 5/2002 |
| JP | 2002132193 A | * 5/2002 |

* cited by examiner

*Primary Examiner*—Sharon E Payne
(74) *Attorney, Agent, or Firm*—Birch, Stewart, Kolasch & Birch, LLP

(57) ABSTRACT

A backlight unit having a supplementary lamp for a smooth starting operation includes multiple light-emitting lamps arranged in one direction on a cover bottom; an inverter printed circuit board (PCB) provided at one rear side or both rear sides of the cover bottom; a first hole provided at a predetermined portion of the inverter PCB; a supplementary lamp provided in the first hole of the inverter PCB; and a second hole provided at a predetermined portion of the cover bottom corresponding to the supplementary lamp.

20 Claims, 2 Drawing Sheets

BACKLIGHT UNIT

This application claims the benefit under 35 U.S.C. §119 of Korean Patent Application No. 10-2005-58413, filed on Jun. 30, 2005, which is hereby incorporated by reference as if fully set forth herein.

BACKGROUND OF THE INVENTION

1. Field of the Invention

The invention relates to a backlight unit, and more particularly, to a backlight unit having a supplementary lamp for a smooth starting operation.

2. Discussion of the Related Art

A cathode ray tube (CRT), a type of flat display device, has been widely used in various applications that include television monitors, measuring machines and information terminals. However, CRTs cannot satisfy demands for miniaturization and weight requirements due to their large size and relatively high weight. Therefore, various types of alternative technologies have been successfully used as substitutes for CRTs including: liquid crystal displays (LCDs), which use an electric field optical effect, plasma display panels (PDPs) which use gas discharge, and electroluminescence display devices (ELDs), which use an electric field luminous effect.

Among the various display devices, LCD devices have been most actively studied and developed because of their advantageous characteristics such as compact size, low weight, and low power consumption. LCDs have been used in many applications that require ultra-thin flat display devices, for example, notebook computers, laptop computers, desktop computers and other types of large display devices. Because of these various applications, the demand for the LCD devices continuously increases.

Most LCD devices operate by controlling the light transmittance to the display image. Accordingly, it is necessary to provide a light source such as a backlight unit in an LCD panel. In general, the backlight unit used in LCD devices has a cylindrical light-emitting lamp, which is classified into two types according to the arrangement of the light-emitting lamps: 1) a direct type backlight unit or 2) an edge type backlight unit.

In edge type backlight units, a lamp unit is provided at one side of a light-guiding plate, with the lamp unit being provided with a lamp that emits light. Additionally, a lamp holder is inserted into both ends of the lamp to protect the lamp, and a reflective sheet is provided with one side of the sheet inserted into the light-guiding plate and surrounding the circumference of the lamp. The sheet reflects the light emitted from the lamp toward the light-guiding plate. Because of this structure, edge type backlight units are generally used in relatively small sized LCD devices such as monitors for laptop computers and desktop computers. Edge type backlight units are advantageous in these applications because they allow the LCD unit to feature great light uniformity, a long life span, and a thin profile.

With the trend toward using larger sized LCD devices of 20-inches or more, the direct type backlight unit is being actively developed. Direct type backlight units include multiple lamps that are formed in parallel on a lower surface of a light-diffusion sheet, whereby an entire surface of the LCD panel is directly illuminated with light. The direct type backlight unit has greater light efficiency as compared with the edge type backlight unit, and is therefore often used with large-sized LCD devices that require high luminance. For example, direct type backlight units are often used for large-sized monitors or televisions. These units are often operated for extended periods of time and often have long service lives, which often causes lamps to burn out or otherwise become inoperable.

The loss of one lamp in an edge type backlight unit only causes a slight decrease in luminance on the LCD screen. As discussed above, direct type LCD devices are provided with multiple lamps directly under the screen of the LCD panel. Accordingly, if one of the lamps burns out or becomes inoperable, the portion of the LCD screen corresponding to the lost lamp is darker than the surrounding portions of the screen.

The edge and direct type LCD devices may use any of the following types of light sources: Electro Luminescence (EL), Light Emitting Diode (LED), Cold Cathode Fluorescent Lamp (CCFL), Hot Cathode Fluorescent Lamp (HCFL) or External Electrode Light-emitting Lamp (EEFL).

Hereinafter, a related art direct type backlight unit will be described with reference to the accompanying drawings.

FIG. 1 shows a schematic view of a direct type backlight unit according to the related art.

As shown in FIG. 1, a related art direct type backlight unit includes multiple light-emitting lamps 1, an outer case 3, and light-scattering devices 5a, 5b and 5c. In this case, the outer case 3 fixes and supports the plurality of light-emitting lamps 1, and the light-scattering devices 5a, 5b and 5c are provided between the light-emitting lamps 1 and an LCD panel (not shown).

The light-scattering devices 5a, 5b and 5c are formed of multiple diffusion sheets and one diffusion plate and prevent the silhouette of the light-emitting lamps 1 from being shown on a display surface of the LCD panel (not shown). This structure and orientation provides a light source with uniform luminance. Also, a reflective sheet 7 is provided inside the outer case 3 for concentrating the light emitted from the light-emitting lamps 1 to the display part of the LCD panel, which improves the efficiency of the unit.

In one aspect of the related art, each light-emitting lamp 1 is formed from a Cold Cathode Fluorescent Lamp (CCFL). Also, electrodes are provided at each end of each CCFL, and the CCFL emits light when electrical power is provided to the electrodes. The ends of each of the light-emitting lamps 1 are fixed to the sides of the outer case 3. Power supplying wires 9 and 9a are connected to the electrodes 2 and 2a that are provided at the ends of each of the light-emitting lamps 1 to transmit power to the light-emitting lamps 1. The power supplying wires 9 and 9a are connected to a driving circuit by an additional connector. Each light-emitting lamp 1 requires an individual connector.

That is, the power supplying wire 9 connected to one electrode of the fluorescent lamp and the power supplying wire 9a connected to the other electrode of the fluorescent lamp are connected together to one connector. Any one of the power supplying wires 9 and 9a is curved around the lower side of the outer case 3, and then connected to the connector.

In the above explanation, the lamp is a CCFL. However, it is possible use an EEFL in the backlight unit.

If the backlight unit using the CCFL or EEFL is maintained under the dark state having a luminous intensity of 0.1(Lux) or less for a long time (that is, non-operating state), the gas of the lamp is in the ground state. Accordingly, when trying to operate the backlight unit, it is difficult to quickly and uniformly operate the backlight unit.

SUMMARY OF THE INVENTION

Accordingly, the invention is directed to a backlight unit, which substantially obviates one or more problems due to limitations and disadvantages of the related art.

An object of the invention is to provide a backlight unit having a supplementary lamp for a smooth starting operation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages, the invention, in part, pertains to a backlight unit that includes multiple light-emitting lamps arranged over a cover bottom in one direction; an inverter printed circuit board (PCB) provided at one rear side or both rear sides of the cover bottom; a first hole provided at a predetermined portion of the inverter PCB; a supplementary lamp provided in the first hole of the inverter PCB; and a second hole provided at a predetermined portion of the cover bottom corresponding to the supplementary lamp.

The supplementary lamp may be formed of a light emitting diode (LED) or a light source that has the same luminosity or operation power as the LED.

Also, multiple first holes may be formed in the inverter PCB, and multiple second holes may be formed in the cover bottom. Also, multiple supplementary lamps may be respectively formed in the plurality of first holes.

The second hole of the cover bottom may be larger than the first hole of the inverter PCB.

In addition, the backlight unit may include supporters provided at both sides of the inverter PCB, so as to maintain a predetermined interval between the inverter PCB and the cover bottom.

Also, the backlight unit may include a reflective sheet provided on an inner surface of the cover bottom.

Further, the backlight unit may include light-scattering devices provided with multiple diffusion sheets and one diffusion plate above the light-emitting lamps.

In another aspect of the invention, in part, a backlight unit is formed from multiple light-emitting lamps arranged in one direction on a cover bottom; an inverter PCB provided at one rear side or both rear sides of the cover bottom; a supplementary lamp provided on a predetermined portion of the inverter PCB; and a hole provided at a predetermined portion of the cover bottom corresponding to the supplementary lamp.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Reference will now be made in detail to the preferred embodiments of the invention, examples of which are illustrated in the accompanying drawings. Wherever possible, the same reference numbers will be used throughout the drawings to refer to the same or like parts.

Hereinafter, backlight units according to some of the preferred embodiments of the invention will be explained with reference to the accompanying drawings.

Figure 1:
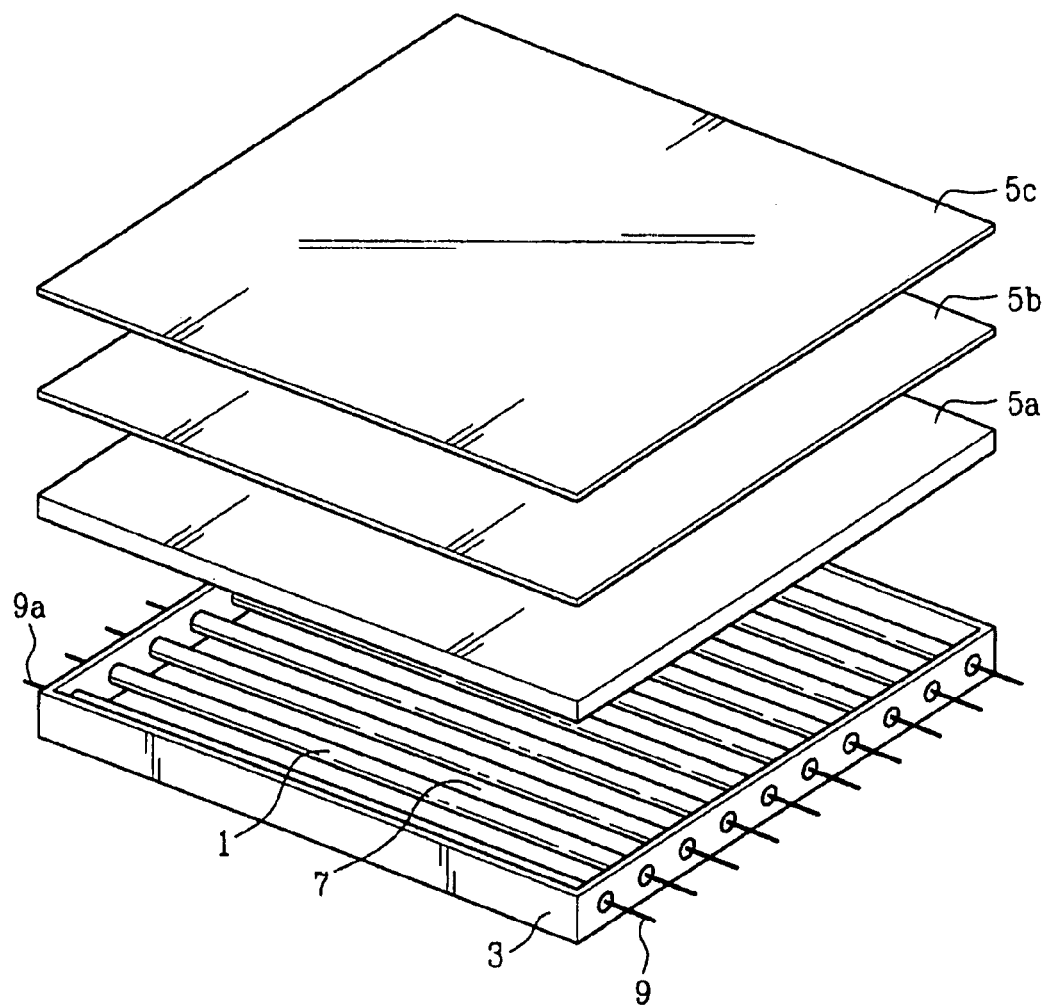
FIG. 1 shows a schematic view of a direct type backlight unit according to the related art.
Figure 2:
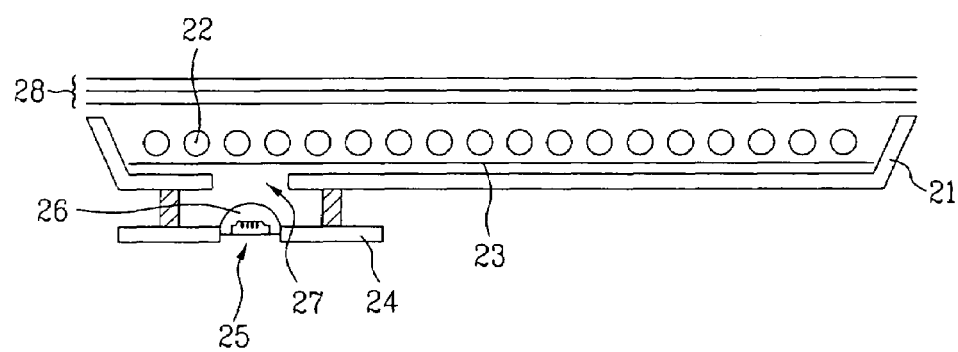
FIG. 2 shows a cross sectional view of a backlight unit according to the first preferred embodiment of the invention.

FIG. 2 shows a cross sectional view of a backlight unit according to a first preferred embodiment of the invention.

In FIG. 2, the backlight unit according to the first preferred embodiment of the invention includes multiple (that is, one or more) light-emitting lamps 22, a reflective sheet 23, an inverter printed circuit board (PCB) 24, a first hole 25, a supplementary lamp 26, a second hole 27, and a light-scattering device 28.

FIG. 2 shows that the multiple light-emitting lamps 22 are arranged in one direction over a cover bottom 21. The reflective sheet 23 is provided over an inner surface of the cover bottom 21 to concentrate light generated from the light-emitting lamps 22 to a display area of an LCD panel. The inverter PCB 24 may be provided at one rear side or at both rear sides of the cover bottom 21. Then, the first hole 25 is formed at a predetermined portion of the inverter PCB 24. Also, the supplementary lamp 26 is provided in the first hole 25 of the inverter PCB 24. The second hole 27 is formed at a predetermined portion of the cover bottom 21 corresponding to the supplementary lamp 26. That is, the supplementary lamp 26 may be placed directly over, placed inside of or placed directly under the second hole 27. The light-scattering device 28 is provided between the LCD panel (not shown) and the light-emitting lamps 22.

The light-emitting lamps 22 may be formed of CCFLs (Cold Cathode Fluorescent Lamp) or EEFLs (External Electrode Fluorescent Lamp). However, any appropriate light source can be used to form the light-emitting lamps. Also, the supplementary lamp 26 may be formed of an LED (Light Emitting Diode) or a light source that has the same luminosity or operation power as the LED. The LED may be a white LED or a colored (red, green or blue) LED or a combination of white or colored LEDs appropriate to generate an ambient-type light.

Multiple supplementary lamps 26 may be provided, whereby multiple first holes 25 may be provided in the inverter PCB 24. Also, multiple second holes 27 may be provided in the cover bottom 21 corresponding to (that is, juxtaposed from) the first holes 25 of the inverter PCB 24.

To promote more efficient transmission of light generated from the supplementary lamp 26 toward the upper side, the second hole 27 of the cover bottom 21 may be larger than the first hole 25 of the inverter PCB 24.

Alternately, a control board may be provided instead of the inverter PCB 24. Also, supporters may be formed at both sides of the inverter PCB 24 to thereby maintain a fixed interval between the inverter PCB 24 and the cover bottom 21.

The light-scattering device 28 prevents the silhouette of the light-emitting lamps from being shown on a display surface of the LCD panel (not shown). To improve the light-scattering efficiency, the light-scattering device 28 may be formed of multiple diffusion sheets and one diffusion plate.

When providing the supplementary lamp 26 for the smooth starting operation of the backlight unit, the inverter PCB 24 may optionally be formed in a rear surface of the cover bottom 21, instead of an additional PCB. Accordingly, it is possible to realize the smooth starting operation of the backlight unit without the additional cost of manufacturing and mounting an additional PCB.

The supplementary lamp 26 is preferably provided at the rear of the light-emitting lamps 22.

The supplementary lamp 26 is positioned at the rear of the light-emitting lamps 22, and the second hole 27 is formed in the cover bottom 21 so as to correspond to the supplementary lamp 26. Accordingly, the light-emitting lamps 22 are directly illuminated with the light emitted from the supplementary lamp 26. That is, even though the backlight unit is maintained in a dark state for a long time, it is possible to perform a smooth starting operation of the backlight unit. In this case, the supplementary lamp 26 preferably uses a short wavelength for maximization of the efficiency. However, any appropriate wavelength may be used.

Also, a method of forming a backlight unit according to the first preferred embodiment of the present invention may include the steps of providing multiple light-emitting lamps arranged in one direction over a cover bottom; mounting an inverter printed circuit board at one rear side or both rear sides of the cover bottom; forming a first hole provided at a predetermined portion of the inverter PCB; mounting a supplementary lamp in the first hole of the inverter printed circuit board; and forming a second hole provided at a predetermined portion of the cover bottom corresponding to the supplementary lamp.

Figure 3:
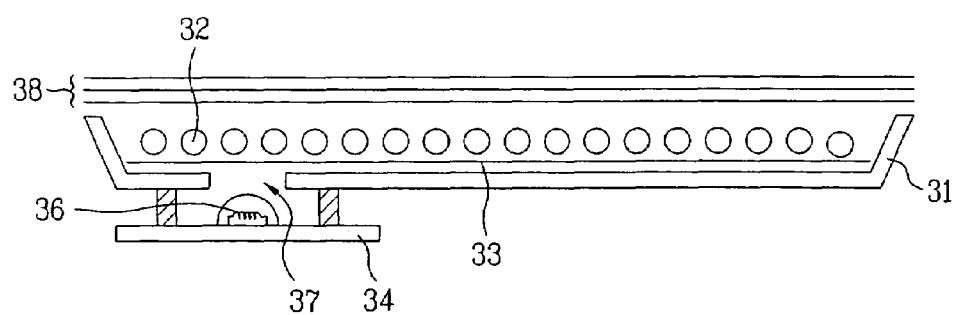
FIG. 3 shows a cross sectional view of a backlight unit according to the second preferred embodiment of the invention.

FIG. 3 shows a cross sectional view of a backlight unit according to a second preferred embodiment of the invention.

As shown in FIG. 3, the backlight unit according to the second embodiment of the invention includes multiple light-emitting lamps 32, a reflective sheet 33, an inverter PCB 34, a supplementary lamp 36, a hole 37, and light-scattering means 38.

At this time, the multiple light-emitting lamps 32 are arranged in one direction over a cover bottom 31. The reflective sheet 33 is provided over an inner surface of the cover bottom 31, so as to concentrate light generated from the light-emitting lamps 32 to a display area of an LCD panel. The inverter PCB 34 may be provided at a rear surface of one side or both sides of the cover bottom 31. The supplementary lamp 36 is provided over a predetermined portion of the inverter PCB 34. The hole 37 is formed at a predetermined portion of the cover bottom 31 corresponding to (that is, located over) the supplementary lamp 36. The light-scattering device 38 is provided between the light-emitting lamps 32 and an LCD panel (not shown).

The multiple supplementary lamps 36 may be provided on the inverter PCB 34, and the plurality of second holes 37 may be provided in the cover bottom 31 corresponding to the supplementary lamps 36.

With the exception that the inverter PCB 34, on which the supplementary lamp 36 is formed, has no hole, the backlight unit according to the second preferred embodiment of the invention is similar in structure to the backlight unit according to the first preferred embodiment of the invention.

The light-emitting lamps 32 may be formed of CCFLs (Cold Cathode Fluorescent Lamp) or EEFLs (External Electrode Fluorescent Lamp). However, any appropriate light source can be used to form the light-emitting lamps. Also, the supplementary lamp 36 may be formed of an LED (Light Emitting Diode) or a light source that has the same luminosity or driving power as the LED. The LED may be a white LED or a colored (red, green or blue) LED or a combination of white or colored LEDs appropriate to generate an ambient-type light.

A control board may optionally be provided instead of the inverter PCB 34. Also, supporters are formed at both sides of the inverter PCB 34 to thereby maintain a fixed interval between the inverter PCB 34 and the cover bottom 31.

The light-scattering device 38 prevents the silhouette of the light-emitting lamps from being shown on a display surface of the LCD panel (not shown). To improve the light-scattering efficiency, the light-scattering device 38 may be formed of multiple diffusion sheets and one diffusion plate.

When providing the supplementary lamp 36 for the smooth starting operation of the backlight unit, the inverter PCB 34 may be formed in a rear surface of the cover bottom 31, instead of using an additional PCB. Accordingly, it is possible to realize the smooth starting operation of the backlight unit without the additional cost of manufacturing and mounting an additional PCB.

The supplementary lamp 36 is provided at the rear of the light-emitting lamps 32.

The supplementary lamp 36 is preferably positioned at the rear of the light-emitting lamps 32, and the hole 37 is formed in the cover bottom 31 corresponding to (that is, directly over) the supplementary lamp 36.

Accordingly, the multiple light-emitting lamps 32 are directly illuminated with the light emitted from the supplementary lamp 36. That is, even though the backlight unit is maintained in the dark state for a long time, it is possible to perform a smooth starting operation of the backlight unit. In this case, the supplementary lamp 36 uses a short wavelength for maximization of the efficiency. However, any appropriate wavelength may be used.

Also, a method of forming a backlight unit according to a second preferred embodiment of the invention may include providing multiple light-emitting lamps arranged in one direction over a cover bottom; mounting an inverter printed circuit board provided at one rear side or both rear sides of the cover bottom; mounting a supplementary lamp provided over a predetermined portion of the inverter printed circuit board; and forming a hole provided at a predetermined portion of the cover bottom corresponding to the supplementary lamp.

As discussed above, the backlight unit according to the invention has the following advantages.

Since the supplementary lamp is mounted on the inverter PCB or the control board, there is no requirement for the additional PCB to mount the supplementary lamp. Thus, it is possible to provide the supplementary lamp without additional cost.

Also, since the backlight unit according to the invention has the supplementary lamp, it is possible to realize a smooth starting operation of the backlight unit even though the backlight unit is maintained a dark state, i.e., a non-operation state.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. A backlight unit comprising:
    a plurality of light-emitting lamps each having a gas therein arranged in one direction over a cover bottom, and irradiating light to a liquid crystal display panel;
    an inverter printed circuit board provided at one rear side or both rear sides of the cover bottom;
    at least one first hole provided at a predetermined portion of the inverter PCB (printed circuit board);
    at least one supplementary lamp provided in the first hole of the inverter printed circuit board; and
    at least one second hole provided at a predetermined portion of the cover bottom corresponding to the supplementary lamp,
    wherein the at least one supplementary lamp is configured to illuminate the plurality of light-emitting lamps through the at least one second hole to activate the gas from a ground state.

2. The backlight unit of claim 1, wherein the at least one supplementary lamp is formed of a light emitting diode or a light source which has the same luminosity or operation power as the light emitting diode.

3. The backlight unit of claim 1, wherein the at least one first hole is formed in the inverter printed circuit board, and the at least one second hole is formed in the cover bottom.

4. The backlight unit of claim 3, wherein the at least one supplementary lamp respectively formed in the at least one first hole.

5. The backlight unit of claim 1, wherein the at least one second hole of the cover bottom is larger than the at least one first hole of the inverter printed circuit board.

6. The backlight unit of claim 1, further comprising supporters provided at both sides of the inverter printed circuit board, so as to maintain a predetermined interval between the inverter printed circuit board and the cover bottom.

7. The backlight unit of claim 1, fiwther comprising a reflective sheet provided over an inner surface of the cover bottom.

8. The backlight unit of claim 1, further comprising a light-scattering device provided with a plurality of diffusion sheets and one diffusion plate above the light-emitting lamps.

9. The backlight unit of claim 1. wherein the light-emitting lamps are formed of cold cathode fluorescent lamps or external electrode fluorescent lamps.

10. A backdight unit comprising:
    a plurality of light-emitting lamps each having a gas therein arranged in one direction over a cover bottom, and irradiating light to a liquid crystal display panel;
    an inverter printed circuit board provided at one rear side or both rear sides of the cover bottom;
    at least one supplementary lamp provided over a predetennined portion of the inverter printed circuit board; and
    at least one hole provided at a predetermined portion of the cover bottom corresponding to the at least one supplementary lamp,
    wherein the at least one supplementary lamp is configured to illuminate the light-emitting lamps through the at least one hole to activate the gas from a ground state.

11. The backlight unit of claim 10, wherein the at least one supplementary lamp is formed over the inverter printed circuit board.

12. The backlight unit of claim 11, wherein the at least one hole is formed in the cover bottom corresponding to the at least one supplementary lamp.

13. The backlight unit of claim 10, wherein the light-emitting lamps are formed of cold cathode fluorescent lamps or external electrode fluorescent Lamps.

14. A method for fanning a backlight unit comprising:
    providing a pktrality of light-emitting lamps each having a gas therein arranged in one direction over a cover bottom, and irradiating light to a liquid crystal display panel;
    mounting an inverter printed circuit board at one rear side or both rear sides of the cover bottom;
    forming at least one first hole provided at a predetermined portion of the inverter PCB (printed circuit board);
    mounting at least one supplementary lamp in the first hole of the inverter printed circuit board; and
    forming at least one second hole provided at a predetermined portion of the cover bottom corresponding to the at least one supplementary lamp,
    wherein the at least one supplementary lamp is configured to illuminate the light-emitting lamps through the at least one second hole to activate the gas from a ground state.

15. The method of claim 14, wherein the at least one supplementary lamp is fanned of a light emitting diode or a light source which has the same luminosity or operation power as the light emitting diode.

16. The method of claim 14, wherein the at least one first hole is formed in the inverter printed circuit board, and the at least one second hole is formed in the cover bottom.

17. The method of claim 16, wherein the at least one supplementary lamp is respectively formed in the at least one first hole.

18. The method of claim 14, wherein the second hole of the cover bottom is larger than the first hole of die inverter printed circuit board.

19. The method of claim 14, further comprising providing supporters at both sides of the inverter printed circuit board, so as to maintain a predetermined interval between the inverter printed circuit board and the cover bottom.

20. The method of claim 14, further comprising forming a reflective sheet provided over an inner surface of the cover bottom.

* * * * *